United States Patent
Kempa et al.

(10) Patent No.: US 7,634,162 B2
(45) Date of Patent: *Dec. 15, 2009

(54) APPARATUS AND METHODS FOR NANOLITHOGRAPHY USING NANOSCALE OPTICS

(75) Inventors: Krzysztof J. Kempa, Billerica, MA (US); Michael J. Naughton, Norwood, MA (US); Zhifeng Ren, Newton, MA (US); Jakub A. Rybczynski, Cambridge, MA (US)

(73) Assignee: The Trustees of Boston College, Chestnut Hill, MA (US)

( * ) Notice: Subject to any disclaimer, the term of this patent is extended or adjusted under 35 U.S.C. 154(b) by 526 days.

This patent is subject to a terminal disclaimer.

(21) Appl. No.: 11/509,271

(22) Filed: Aug. 24, 2006

(65) Prior Publication Data
US 2007/0105240 A1 May 10, 2007

Related U.S. Application Data

(60) Provisional application No. 60/711,003, filed on Aug. 24, 2005.

(51) Int. Cl.
*G02B 6/32* (2006.01)
*G02B 6/06* (2006.01)
*G02B 6/00* (2006.01)

(52) U.S. Cl. .................. 385/33; 385/15; 385/116; 385/120

(58) Field of Classification Search ................ None
See application file for complete search history.

(56) References Cited

U.S. PATENT DOCUMENTS

| | | | |
|---|---|---|---|
| 3,312,870 A | 4/1967 | Rhoades | |
| 3,711,848 A | 1/1973 | Martens | 340/280 |
| 3,990,914 A | 11/1976 | Weinstein et al. | 136/89 |
| 4,105,470 A | 8/1978 | Skotheim | 136/89 SJ |
| 4,197,142 A | 4/1980 | Bolton et al. | 136/89 SJ |
| 4,360,703 A | 11/1982 | Bolton et al. | 136/263 |
| 4,445,050 A | 4/1984 | Marks | 307/145 |

(Continued)

FOREIGN PATENT DOCUMENTS

EP    1507298    2/2005

(Continued)

OTHER PUBLICATIONS

International Search Report based on PCT/US2006/33010 dated Feb. 22, 2007.

(Continued)

*Primary Examiner*—Michelle R Connelly Cushwa
(74) *Attorney, Agent, or Firm*—Greenberg Traurig, LLP; David J. Dykeman; Danielle T. Abramson

(57) ABSTRACT

An apparatus and methods for nanolithography using nanoscale optics are disclosed herein. Submicron-scale structures may be obtained using standard photolithography systems with a de-magnifying lens. A de-magnifying lens for use in a standard photolithography system includes a film having a top surface, a bottom surface and a plurality of cylindrical channels containing a dielectric material; and an array of carbon nanotubes penetrating the film through the plurality of cylindrical channels, wherein an image on the top surface of the film is converted into a de-magnified image on the bottom surface of the film by the carbon nanotubes.

24 Claims, 10 Drawing Sheets

U.S. PATENT DOCUMENTS

| | | | | |
|---|---|---|---|---|
| 4,445,080 A | 4/1984 | Curtiss | | 318/798 |
| 4,774,554 A | 9/1988 | Dentai et al. | | 357/17 |
| 4,783,605 A | 11/1988 | Tomisawa et al. | | 307/450 |
| 4,803,688 A | 2/1989 | Lawandy | | 372/21 |
| 4,854,876 A | 8/1989 | Heath et al. | | 434/29 |
| 4,886,555 A | 12/1989 | Hackstein et al. | | 136/255 |
| 4,913,744 A | 4/1990 | Hoegl et al. | | 136/244 |
| 5,009,958 A | 4/1991 | Yamashita et al. | | 428/411.1 |
| 5,028,109 A | 7/1991 | Lawandy | | 350/96.12 |
| 5,084,365 A | 1/1992 | Gratzel et al. | | 429/111 |
| 5,105,305 A | 4/1992 | Betzig et al. | | 359/368 |
| 5,157,674 A | 10/1992 | Lawandy | | 372/22 |
| 5,171,373 A | 12/1992 | Hebard et al. | | 136/244 |
| 5,185,208 A | 2/1993 | Yamashita et al. | | 428/411.1 |
| 5,211,762 A | 5/1993 | Isoda et al. | | 136/263 |
| 5,233,621 A | 8/1993 | Lawandy | | 372/22 |
| 5,250,378 A | 10/1993 | Wang | | 430/83 |
| 5,253,258 A | 10/1993 | Lawandy | | 372/22 |
| 5,264,048 A | 11/1993 | Yoshikawa et al. | | 136/263 |
| 5,267,336 A | 11/1993 | Sriram et al. | | 385/2 |
| 5,272,330 A | 12/1993 | Betzig et al. | | 250/216 |
| 5,291,012 A | 3/1994 | Shimizu et al. | | 250/216 |
| 5,331,183 A | 7/1994 | Sariciftci et al. | | 257/40 |
| 5,332,910 A | 7/1994 | Haraguchi et al. | | 257/13 |
| 5,333,000 A | 7/1994 | Hietala et al. | | 342/368 |
| 5,360,764 A | 11/1994 | Celotta et al. | | 437/173 |
| 5,380,410 A | 1/1995 | Sawaki et al. | | 204/150 |
| 5,383,038 A | 1/1995 | Lawandy | | 359/7 |
| 5,434,878 A | 7/1995 | Lawandy | | 372/43 |
| 5,437,736 A | 8/1995 | Cole | | 136/259 |
| 5,448,582 A | 9/1995 | Lawandy | | 372/42 |
| 5,479,432 A | 12/1995 | Lawandy | | 372/102 |
| 5,481,630 A | 1/1996 | Lawandy | | 385/16 |
| 5,489,774 A | 2/1996 | Akamine et al. | | 250/234 |
| 5,493,628 A | 2/1996 | Lawandy | | 385/122 |
| 5,524,011 A | 6/1996 | Lawandy | | 372/22 |
| 5,547,705 A | 8/1996 | Fukuzawa et al. | | 427/162 |
| 5,548,113 A | 8/1996 | Goldberg et al. | | 250/234 |
| 5,585,962 A | 12/1996 | Dixon | | 359/328 |
| 5,589,235 A | 12/1996 | Ogawa | | 428/1 |
| 5,604,635 A | 2/1997 | Lawandy | | 359/620 |
| 5,625,456 A | 4/1997 | Lawandy | | 356/376 |
| 5,689,603 A | 11/1997 | Huth | | 385/131 |
| 5,694,498 A | 12/1997 | Manasson et al. | | 385/15 |
| 5,747,861 A | 5/1998 | Dentai | | 257/435 |
| 5,789,742 A | 8/1998 | Wolff | | 250/227.11 |
| 5,796,506 A | 8/1998 | Tsai | | 359/191 |
| 5,862,286 A | 1/1999 | Imanishi et al. | | 385/122 |
| 5,872,422 A | 2/1999 | Xu et al. | | 313/311 |
| 5,888,371 A | 3/1999 | Quate | | 205/122 |
| 5,894,122 A | 4/1999 | Tomita | | 250/234 |
| 5,897,945 A | 4/1999 | Lieber et al. | | 428/323 |
| 5,902,416 A | 5/1999 | Kern et al. | | 136/244 |
| 5,973,444 A | 10/1999 | Xu et al. | | 313/309 |
| 5,994,691 A | 11/1999 | Konada | | 250/234 |
| 6,038,060 A | 3/2000 | Crowley | | 359/328 |
| 6,043,496 A | 3/2000 | Tennant | | 250/492.1 |
| 6,052,238 A | 4/2000 | Ebbesen et al. | | 359/738 |
| 6,083,843 A | 7/2000 | Ohja et al. | | 438/710 |
| 6,096,496 A | 8/2000 | Frankel | | 435/4 |
| 6,100,525 A | 8/2000 | Eden | | 250/338.1 |
| 6,146,227 A | 11/2000 | Mancevski | | 445/24 |
| 6,183,714 B1 | 2/2001 | Smalley et al. | | 423/447.3 |
| 6,194,711 B1 | 2/2001 | Tomita | | 250/234 |
| 6,201,242 B1 | 3/2001 | Eden et al. | | 250/332 |
| 6,211,532 B1 | 4/2001 | Yagi | | 257/40 |
| 6,212,292 B1 | 4/2001 | Soares | | 382/141 |
| 6,233,045 B1 | 5/2001 | Suni et al. | | 356/28.5 |
| 6,258,401 B1 | 7/2001 | Crowley | | 427/126.3 |
| 6,271,130 B1 | 8/2001 | Rajh et al. | | 438/677 |
| 6,278,231 B1 | 8/2001 | Iwasaki et al. | | 313/310 |
| 6,310,583 B1 | 10/2001 | Saunders | | 343/786 |
| 6,322,938 B1 | 11/2001 | Cohn | | 430/8 |
| 6,365,466 B1 | 4/2002 | Krivokapic | | 438/283 |
| 6,410,935 B1 | 6/2002 | Rajh et al. | | 257/43 |
| 6,415,082 B1 | 7/2002 | Wach | | 385/39 |
| 6,445,006 B1 | 9/2002 | Brandes et al. | | 257/76 |
| 6,456,423 B1 | 9/2002 | Nayfeh et al. | | 359/328 |
| 6,472,594 B1 | 10/2002 | Ichinose et al. | | 136/256 |
| 6,514,771 B1 | 2/2003 | Seul | | 436/518 |
| 6,515,274 B1 | 2/2003 | Moskovits et al. | | 250/216 |
| 6,569,575 B1 | 5/2003 | Biebuyck et al. | | 430/5 |
| 6,621,079 B1 | 9/2003 | Shao et al. | | 250/306 |
| 6,642,129 B2 | 11/2003 | Liu et al. | | 438/496 |
| 6,700,550 B2 | 3/2004 | Crowley | | 343/792.5 |
| 6,724,064 B2 | 4/2004 | Watanabe et al. | | 257/459 |
| 6,749,827 B2 | 6/2004 | Smalley et al. | | 423/447.3 |
| 6,756,025 B2 | 6/2004 | Colbert et al. | | 423/447.3 |
| 6,782,154 B2 | 8/2004 | Zhao et al. | | 385/16 |
| 6,824,755 B2 | 11/2004 | Colbert et al. | | 423/447.1 |
| 6,833,162 B2 | 12/2004 | Chattopadhyay et al. | | 427/273 |
| 6,835,534 B2 | 12/2004 | Weiss et al. | | 430/311 |
| 6,867,443 B2 | 3/2005 | Liu et al. | | 257/226 |
| 6,882,051 B2 | 4/2005 | Majumdar et al. | | 257/746 |
| 6,891,623 B1 | 5/2005 | Baudon et al. | | 356/491 |
| 6,897,158 B2 | 5/2005 | Sharma | | 438/713 |
| 6,913,713 B2 | 7/2005 | Chittibabu et al. | | 252/501.1 |
| 6,936,233 B2 | 8/2005 | Smalley et al. | | 423/447.1 |
| 6,949,237 B2 | 9/2005 | Smalley et al. | | 423/447.3 |
| 6,969,897 B2 | 11/2005 | Kim, II | | 257/432 |
| 6,979,709 B2 | 12/2005 | Smalley et al. | | 524/495 |
| 6,985,223 B2 | 1/2006 | Drachev et al. | | 356/301 |
| 6,996,147 B2 | 2/2006 | Majumdar et al. | | 372/43 |
| 7,005,378 B2 | 2/2006 | Crocker, Jr. et al. | | 438/674 |
| 7,008,604 B2 | 3/2006 | Smalley et al. | | 423/447.1 |
| 7,013,708 B1 | 3/2006 | Cho et al. | | 73/31.05 |
| 7,035,498 B2 | 4/2006 | Wu et al. | | 385/16 |
| 7,041,620 B2 | 5/2006 | Smalley et al. | | 502/182 |
| 7,048,903 B2 | 5/2006 | Colbert et al. | | 423/447.1 |
| 7,048,999 B2 | 5/2006 | Smalley et al. | | 428/367 |
| 7,052,666 B2 | 5/2006 | Colbert et al. | | 423/447.1 |
| 7,053,351 B2 | 5/2006 | Li et al. | | 250/201.3 |
| 7,057,832 B2 | 6/2006 | Wu et al. | | 359/811 |
| 7,060,510 B2 | 6/2006 | Bonnell et al. | | 438/3 |
| 7,067,098 B2 | 6/2006 | Colbert et al. | | 423/447.1 |
| 7,071,406 B2 | 7/2006 | Smalley et al. | | 136/252 |
| 7,097,820 B2 | 8/2006 | Colbert et al. | | 423/447.2 |
| 7,115,864 B2 | 10/2006 | Colbert et al. | | 250/306 |
| 7,126,183 B2 | 10/2006 | Forbes et al. | | 257/314 |
| 7,129,567 B2 | 10/2006 | Kirby et al. | | 257/621 |
| 7,132,711 B2 | 11/2006 | Forbes et al. | | 257/314 |
| 7,132,994 B2 | 11/2006 | Crowley | | 343/792.5 |
| 7,208,793 B2 | 4/2007 | Bhattacharyya | | 257/314 |
| 7,229,498 B2 * | 6/2007 | Norman et al. | | 117/89 |
| 7,489,870 B2 * | 2/2009 | Hillis et al. | | 398/115 |
| 2001/0001681 A1 | 5/2001 | Zhang et al. | | 427/508 |
| 2002/0102196 A1 | 8/2002 | Smalley et al. | | 422/198 |
| 2002/0102201 A1 | 8/2002 | Colbert et al. | | 423/445 R |
| 2002/0122873 A1 | 9/2002 | Mirkin et al. | | 427/2.1 |
| 2002/0150524 A1 | 10/2002 | Smalley et al. | | 422/198 |
| 2002/0159943 A1 | 10/2002 | Smalley et al. | | 423/447.1 |
| 2003/0021967 A1 | 1/2003 | Sagiv et al. | | 428/209 |
| 2003/0068432 A1 | 4/2003 | Dai et al. | | 427/58 |
| 2003/0134267 A1 | 7/2003 | Kang et al. | | 435/4 |
| 2003/0189235 A1 * | 10/2003 | Watanabe et al. | | 257/432 |
| 2003/0213922 A1 | 11/2003 | Gordon et al. | | 250/492.1 |
| 2004/0027675 A1 * | 2/2004 | Wu et al. | | 359/619 |
| 2004/0075464 A1 | 4/2004 | Samuelson et al. | | 326/37 |
| 2004/0077156 A1 | 4/2004 | Tsakalakos et al. | | 438/479 |
| 2004/0131843 A1 | 7/2004 | Mirkin et al. | | 428/327 |
| 2004/0169615 A1 | 9/2004 | Crowley | | 343/810 |
| 2004/0232321 A1 | 11/2004 | Miles et al. | | 250/235 |
| 2004/0239210 A1 | 12/2004 | Pinkerton et al. | | 310/309 |
| 2004/0245209 A1 | 12/2004 | Jung et al. | | 216/8 |

| | | | |
|---|---|---|---|
| 2005/0062668 A1 | 3/2005 | Crowley | 343/795 |
| 2005/0116861 A1 | 6/2005 | Anazawa et al. | 343/700 |
| 2005/0181409 A1 | 8/2005 | Park et al. | 435/6 |
| 2005/0189480 A1 | 9/2005 | Hollingsworth | 250/234 |
| 2005/0191434 A1 | 9/2005 | Mirin et al. | 427/457 |
| 2005/0194035 A1 | 9/2005 | Jin et al. | 136/252 |
| 2005/0194038 A1 | 9/2005 | Brabec et al. | 136/256 |
| 2005/0199894 A1 | 9/2005 | Rinzler et al. | 257/94 |
| 2005/0211294 A1 | 9/2005 | Chittibabu et al. | 136/263 |
| 2005/0221202 A1 | 10/2005 | Gofron | 430/5 |
| 2005/0221577 A1 | 10/2005 | Li et al. | 438/401 |
| 2005/0230270 A1 | 10/2005 | Ren et al. | 205/777.5 |
| 2005/0243410 A1 | 11/2005 | Bachmann et al. | 359/342 |
| 2005/0255237 A1 | 11/2005 | Zhang et al. | 427/180 |
| 2005/0272856 A1 | 12/2005 | Cooper et al. | 254/496 |
| 2006/0014001 A1 | 1/2006 | Zhang et al. | 428/195.1 |
| 2006/0024438 A1 | 2/2006 | Ku et al. | 427/237 |
| 2006/0027543 A1 | 2/2006 | Cheng | 219/121.69 |
| 2006/0040057 A1 | 2/2006 | Sheehan et al. | 427/256 |
| 2006/0043257 A1 | 3/2006 | Cheng et al. | 250/201.3 |
| 2006/0054922 A1 | 3/2006 | Pettit | 257/116 |
| 2006/0082379 A1 | 4/2006 | Liu et al. | 324/754 |
| 2006/0110618 A1 | 5/2006 | Manivannan et al. | 428/566 |
| 2006/0158760 A1 | 7/2006 | Ambrosio et al. | 359/883 |
| 2007/0047056 A1 | 3/2007 | Kempa et al. | 359/245 |
| 2007/0081242 A1 | 4/2007 | Kempa et al. | 359/486 |
| 2007/0105240 A1 | 5/2007 | Kempa et al. | 438/3 |
| 2007/0107103 A1 | 5/2007 | Kempa et al. | 977/834 |
| 2007/0137697 A1 | 6/2007 | Kempa et al. | 136/256 |
| 2007/0138376 A1 | 6/2007 | Naughton et al. | 250/216 |
| 2007/0240757 A1 | 10/2007 | Ren et al. | 136/256 |
| 2008/0131698 A1* | 6/2008 | Crowley | 428/376 |

FOREIGN PATENT DOCUMENTS

WO    WO 03/016901    2/2003

OTHER PUBLICATIONS

Ambit Corporation Press Release, "AMBIT Corporation Announces Solar Energy Initiative", (4 pages) Apr. 26, 2006 at www.nanotech-now.com/news.cgi?story_id=15038, accessed on Oct. 25, 2007.

Nanotechnology News, "Carbon Nanotube Structures Could Provide More Efficient Solar Power for Soldiers", (3 pages), Oct. 15, 2007 at www.azonano.com/news.asp?newsID=58, accessed on Oct. 25, 2007.

Center for Multifunctional Polymer Nanomaterials and Devices (CMPND), "Polymer Photonics", (6 pages), © 2003 found at www.capce.ohio-state.edu/CMPND/Photonics.htm, accessed on Oct. 25, 2007.

Atwater et al., *The New "p-n Junction": Plasmonics Enables Photonic Access to the Nanoworld*, MRS Bulletin, 30 (5), pp. 385-389, ISSN 0883-7694, May 2005.

Balasubramanian et al., *Biosensors Based on Carbon Nanotubes*, Anal. Bioanal. Chem. vol. 385, pp. 452-468, 2006.

Burns, G., *Solid State Physics*, Academic Press Inc., Orlando, pp. 487-489, 1985.

Delzeit et al., *Growth of Carbon Nanotubes by Thermal and Plasma Chemical Vapour Deposition Processes and Applications in Microscopy*, Nanotechnology, vol. 13, pp. 280-284, 2002.

Evident Technologies, Inc., *Quantum Dots in High Efficiency Photovoltaics Using EviDots*, pp. 1-8, Jan. 2006.

Fumeaux et al., *Measurement of the Resonant Lengths of Infrared Dipole Antennas*, Infrared Physics and Technology, vol. 41, pp. 271-281, 2000.

Griggs et al., *P-n Junction Heterostructure Device Physics Model of a Four Junction Solar Cell*, Proceedings of SPIE, vol. 6339, pp. 63390D1-63390-D8, 2006.

Guo et al., *Metal-Insulator-Semiconductor Electrostatics of Carbon Nanotubes*, Applied Physics Letters, vol. 81, No. 8, pp. 1486-1488, Aug. 19, 2002.

Guo et al., *Performance Projections for Ballistic Carbon Nanotube Field-Effect Transistors*, Applied Physics Letters, vol. 80, No. 17, pp. 3192-3194, Apr. 29, 2002.

Heavens, O.S., *Optical Properties of Thin Solid Films*, Dover Publications, Inc., New York, pp. 113-116, 1955.

Huang et al., *Growth of Large Periodic Arrays of Carbon Nanotubes*, Applied Physics Letters, vol. 82, No. 3, pp. 460-462, Jan. 20, 2003.

Jorio et al., *Polarized Resonant Raman Study of Isolated Single-Wall Carbon Nanotubes: Symmetry Selection Rules, Dipolar and Multipolar Antenna Effects*, Physical Review B, vol. 65, pp. 121402-1-121402-4, 2002.

Kayes et al., *Comparison of the Device Physics Principles of Planar and Radial p-n Junction Nanorod Solar Cells*, Journal of Applied Physics, 97 (11), Art. No. 114302, pp. 114302-1-114302-11, 2005.

Kayes et al., *Radial pn Junction Nanorod Solar Cells: Device Physics Principles and Routes to Fabrication in Silicon*, Photovoltaic Specialists Conference 2005, Conference Record of the Thirty-Fifth Proceedings of the IEEE, pp. 55-58, Jan. 3-7, 2005.

Kempa et al., *Photonic Crystals Based on Periodic Arrays of Aligned Carbon Nanotubes*, Nano Letters, vol. 3, No. 1, pp. 13-18, 2003.

Milanovic et al., *A Simple Process for Lateral Single Crystal Silicon Nanowires*, Proceedings of IMECE'02, 2002 ASME International Engineering Congress & Exposition, New Orleans, LA, IMCE 2002-33392, pp. 1-7, Nov. 17-22, 2002.

Moon et al., *Field Theory for Engineers*, D. Van Nostrand Company Inc., Princeton, NJ, pp. 504-509, 1961.

Ren et al., *Synthesis of Large Arrays of Well-Aligned Carbon Nanotubes on Glass*, Science, vol. 282, pp. 1105-1107, Nov. 6, 1998.

Sotiropoulou et al., *Carbon Nanotube Array-Based Biosensor*, Anal. Bioanal. Chem., vol. 375, pp. 103-105, 2003.

Staebler et al., *Reversible Conductivity Changes in Discharge-Produced Amorphous Si*, Applied Physics Letters, vol. 31, No. 4, pp. 292-294, 1977.

Teo et al., *Uniform Patterned Growth of Carbon Nanotubes Without Surface Carbon*, Applied Physics Letters, vol. 79, No. 10, pp. 1534-1536, Sep. 3, 2001.

Terman, F.E., *Radio Engineering*, McGraw-Hill Book Company, New York, Chapter 14, pp. 662-731, 1947.

von Roedern, B. et al., *The Role of Polycrystalline Thin-Film PV Technologies for Achieving Mid-Term Market Competitive PV Modules*, Conference Record of 31st IEEE Photovoltaics Specialists Conference and Exhibition, Lake Buena Vista, FL, Jan. 3-7, 2005.

Wang et al., *Receiving and transmitting Light-Like Radio Waves: Antenna Effect in Arrays of Aligned Carbon Nanotubes*, Applied Physics Letters, vol. 85, No. 13, pp. 2607-2609, Sep. 27, 2004.

Yamamoto, et al., *Photoconductive Coaxial Nanotubes of Molecularly Connected Electron Donor and Acceptor Layers*, Science, vol. 314, pp. 1761-1764, Dec. 15, 2006.

* cited by examiner

FIG. 1A
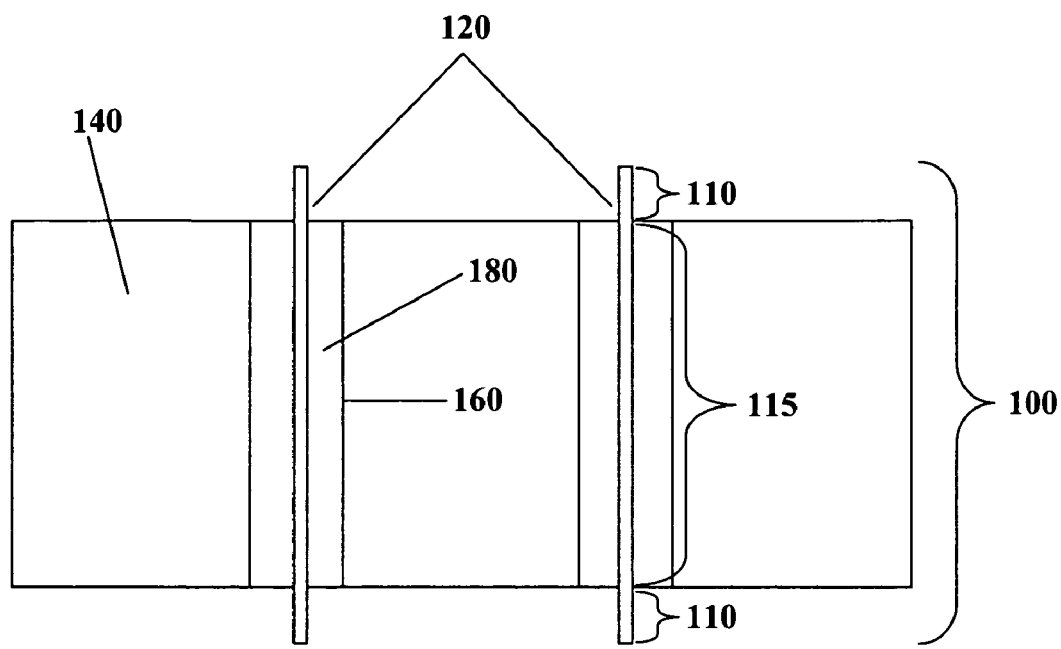
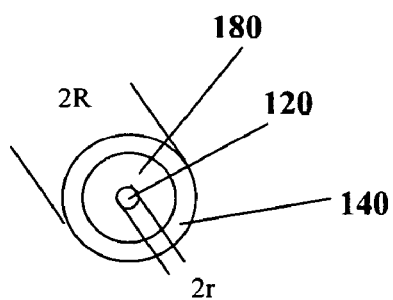
FIG. 1B

APPARATUS AND METHODS FOR NANOLITHOGRAPHY USING NANOSCALE OPTICS

RELATED APPLICATIONS

This application claims the benefit of U.S. Provisional Application Ser. No. 60/711,003, filed Aug. 24, 2005, and the entirety of this application is hereby incorporated herein by reference for the teachings therein.

GOVERNMENT SUPPORT

The invention was supported, in whole or in part, by Contract No. DAAD16-02-C-0037 from the U.S. Army Natick Soldier Systems Center. The Government has certain rights in the invention.

FIELD

The embodiments disclosed herein relate to the field of optics, and more particularly to an apparatus and methods for nanolithography using nanoscale optics.

BACKGROUND

Nano-optics is the study of optical interactions with matter on a subwavelength scale. Nano-optics has numerous applications in optical technologies such as nanolithography, optical data storage, photochemistry on a nanometer scale, solar cells, materials imaging and surface modification with sub-wavelength lateral resolution, local linear and nonlinear spectroscopy of biological and solid-state structures, quantum computing, quantum communication and optical networking.

Nanolithography is a method for the creation of nanoscale structures. Usually one creates a pattern of a desired nano-structure in a template material, and then uses this template to fabricate the nanostructure. Nanolithography can employ a computer controlled electron beam and an electron sensitive template material. Several other nanolithography techniques employ nanotools, like the scanning probe microscope (SPM) or atomic force microscope (ATM) to create the templates. However, these techniques are extremely expensive and slow.

One common method of nanolithography, used particularly in the creation of microchips, is known as photolithography. Photolithography is limited in the size it may reduce to, however, because if the wavelength of light used is made too small the optical lens simply absorbs the light in its entirety. Photolithography is limited due to light diffraction limitations, i.e. the nanostructure dimensions are smaller than the wavelength of the light. Currently, photolithography can create features around the 90 nm scale. This means that photolithography cannot reach the super-fine sizes of some alternate technologies, such as electron-beam lithography. Using an electron beam to draw a pattern nanometer by nanometer, incredibly small sizes (on the order of 20 nm) may be achieved. Industrial applications of electron-beam lithography have been limited because it is more expensive and time consuming than photolithography. Recent nanolithography technologies, such as extreme ultraviolet lithography, are capable of using light at wavelengths of about 13.5 nm. While hurdles still exist in this new field, nanolithography promises the possibility of sizes far below those produced by current industry standards. Other nanolithography techniques include dip-pen nanolithography, in which a small tip is used to deposit molecules on a surface. Dip-pen nanolithography can achieve very small sizes, but cannot currently go below 40 nm.

Prior art nanolithography techniques for generating structures on various surfaces are described in U.S. Pat. No. 6,569,575 entitled "Optical lithography beyond conventional resolution limits;" U.S. Pat. No. 6,833,162 entitled "Colored nanolithography on glass and plastic substrates;" U.S. Pat. No. 7,057,832 entitled "Microlens for projection lithography and method of preparation thereof;" and U.S. Patent Application Publication No. 20050221202 entitled "Wavelength filtering in nanolithography," all of which are hereby incorporated by reference in their entireties for the teachings therein.

It would be beneficial to develop an inexpensive and effective solution for nanolithography that may both successfully and easily be used to create sub-micron structures.

SUMMARY

An apparatus and methods for an apparatus and methods for nanolithography using nanoscale optics are disclosed herein. Submicron-scale structures may be obtained using standard photolithography systems with a de-magnifying lens.

According to aspects illustrated herein, there is provided a de-magnifying lens for use in a standard photolithography system that includes a film having a top surface, a bottom surface and a plurality of cylindrical channels containing a dielectric material; and an array of carbon nanotubes penetrating the film through the plurality of cylindrical channels, wherein an image on the top surface of the film is converted into a de-magnified image on the bottom surface of the film by the carbon nanotubes.

According to aspects illustrated herein, there is provided a nanolithography apparatus having a metallic film having a top surface, a bottom surface and a plurality of cylindrical channels containing a dielectric material; and an array of nanorods penetrating the metallic film through the plurality of cylindrical channels, the array of nanorods having a protruding portion that extends beyond a surface of the metallic film and an embedded portion that is within the metallic film.

According to aspects illustrated herein, there is provided a method for obtaining a de-magnified image that includes coating the surface of a substrate base with a photoresist material; focusing an optical signal through a system of lenses onto a photomask that contains a projected image; passing the optical signal through the photomask; and focusing the optical signal through a de-magnifying lens, the de-magnifying lens comprising a film having a top surface, a bottom surface and a plurality of cylindrical channels containing a dielectric material and an array of carbon nanotubes penetrating the film through the plurality of cylindrical channels, wherein an image on the top surface of the film is converted into a de-magnified image on the bottom surface of the film by the carbon nanotubes.

BRIEF DESCRIPTION OF THE DRAWINGS

The presently disclosed embodiments will be further explained with reference to the attached drawings, wherein like structures are referred to by like numerals throughout the several views. The drawings are not necessarily to scale, the emphasis having instead been generally placed upon illustrating the principles of the presently disclosed embodiments.

FIG. 1A shows a schematic image of a nano-optics apparatus that includes an array of carbon nanotubes, the array consists of portions that protrude from a metallic film, known as nano-optical antennas, and a portion that is embedded within the metallic film, known as a nano-coaxial transmission line. The nano-optics apparatus is synthesized in accordance with the presently disclosed embodiments.

FIG. 1B shows a cross-sectional view of the nano-coaxial transmission lines of FIG. 1A.

Figure 2A:
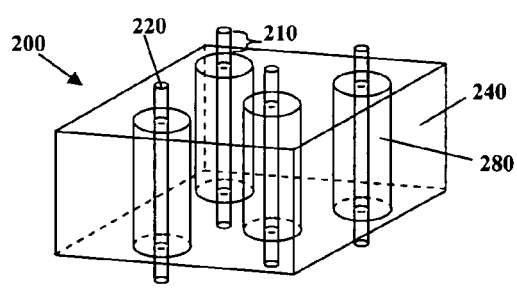
FIG. 2A shows a three-dimensional configuration of a nano-optics apparatus synthesized in accordance with the presently disclosed embodiments.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

The embodiments disclosed herein relate to the field of nanoscale optics and more particularly to an apparatus and methods for obtaining submicron-scale structures using standard photolithography systems with a de-magnifying lens.

The presently disclosed embodiments use light transmitting nanostructures (nanocoaxes) as optical processors, capable of de-magnifying and delivery of the optical pattern of a nanostructure onto a photoresist template. The nano-coaxial transmission lines act as a de-magnifying lens imaging a super-wavelength pattern into the identical, but scaled-down sub-wavelength pattern.

A nano-optics apparatus includes an array of carbon nanotubes that penetrate a film through cylindrical channels that are filled with a dielectric material. Each of the carbon nanotubes comprise two portions that protrude from the film and act as nano-optical antennas; and portions that are embedded within the film and act as a nano-coaxial transmission line (nano-CTL). The nano-optical antennas are capable of receiving (collecting); transmitting; and re-emitting an optical signal. The nano-coaxial transmission line (nano-CTL) converts energy trapped in currents along the nano-optical antenna into a manageable signal and allows for propagation of the optical signal with a wavelength exceeding perpendicular dimensions of the carbon nanotubes. The nano-optics apparatus is used as a de-magnifying lens for nanolithography.

The following definitions are used to describe the various aspects and characteristics of the presently disclosed embodiments.

As referred to herein, "nano-optics" and "nanoscale optics" are the study of optical interactions with matter on a subwavelength scale.

As referred to herein, "carbon nanotube", "nanowire", and "nanorod" are used interchangeably.

As referred to herein, "nanoscale" refers to distances and features below about 5000 nanometers (one nanometer equals one billionth of a meter).

As referred to herein, "single-walled carbon nanotubes" (SWCNTs) include one graphene sheet rolled into a cylinder. "Double-walled carbon nanotubes" (DWCNTs) include two graphene sheets in parallel, and those with multiple sheets (typically about 3 to about 30) are "multi-walled carbon nanotubes" (MWCNTs).

As referred to herein, "single-core coaxial transmission lines" (SCCTL) include one nanotube at the center. A "double-core coaxial transmission lines" (DCCTL) include two nanotubes at the center. As referred to herein, carbon nanotubes (CNTs) are "aligned" wherein the longitudinal axis of individual tubules are oriented in a plane substantially parallel to one another.

As referred to herein, a "tubule" is an individual CNT.

As referred to herein, "linear CNTs" refer to CNTs that do not contain any branches originating from the surface of individual CNT tubules along their linear axes.

As referred to herein, "array" refers to a plurality of CNT tubules that are proximal to one another.

As referred to herein, a "nanoscale coaxial line" refers to a nanoscale coaxial wire, which includes a plurality of concentric layers. In an embodiment, the nanoscale coaxial line has three concentric layers: an internal conductor, a photovoltaic coating around the core, and an outer conductor. Transmission of electromagnetic energy inside the coaxial line is wavelength-independent and happens in transverse electromagnetic (TEM) mode. In an embodiment, the internal conductor is a metallic core. In an embodiment, the outer conductor is a metallic shielding.

As referred to herein, a "nanoscale coplanar line" refers to a nanoscale coplanar structure, which includes a plurality of parallel layers. In an embodiment, the nanoscale coplanar line has three parallel layers: two metallic conductors, with a photovoltaic coating between them. Transmission of electromagnetic energy inside the coplanar line is wavelength-independent and happens in transverse electromagnetic (TEM) mode.

As referred to herein, "transverse electromagnetic (TEM)" refers to an electromagnetic mode in a transmission line for which both the electric and magnetic fields are perpendicular to the direction of propagation. Other possible modes include but are not limited to transverse electric (TE), in which only the electric field is perpendicular to the direction of propagation, and transverse magnetic (TM), in which only the magnetic field is perpendicular to the direction of propagation.

As referred to herein, a "catalytic transition metal" can be any transition metal, transition metal alloy or mixture thereof. Examples of a catalytic transition metals include, but are not limited to, nickel (Ni), silver (Ag), gold (Au), platinum (Pt), palladium (Pd), iron (Fe), ruthenium (Ru), osmium (Os), cobalt (Co), rhodium (Rh) and iridium (Ir). In an embodiment, the catalytic transition metal comprises nickel (Ni).

As referred to herein, a "catalytic transition metal alloy" can be any transition metal alloy. Preferably, a catalytic transition metal alloy is a homogeneous mixture or solid solution of two or more transition metals. Examples of a catalytic transition metal alloy include, but are not limited to, a nickel/gold (Ni/Au) alloy and a cobalt/iron (Co/Fe) alloy.

The terms "nanotubes," "nanowires," "nanorods," "nanocrystals," "nanoparticles" and "nanostructures" are employed interchangeably herein. These terms primarily refer to material structures having sizes, e.g., characterized by their largest dimension, in a range of a few nanometers (nm) to about a few microns. In applications where highly symmetric structures are generated, the sizes (largest dimensions) can be as large as tens of microns.

As referred to herein, "CVD" is chemical vapor deposition. In CVD, gaseous mixtures of chemicals are dissociated at high temperature (for example, $CO_2$ into C and $O_2$). This is the "CV" part of CVD. Some of the liberated molecules may then be deposited on a nearby substrate (the "D" in CVD), with the rest pumped away. Examples of CVD methods include but not limited to, "plasma enhanced chemical vapor deposition" (PECVD), "hot filament chemical vapor deposition" (HFCVD), and "synchrotron radiation chemical vapor deposition" (SRCVD).

As referred to herein, an "optical signal" refers to any electromagnetic radiation pulse including gamma rays, X-rays, ultraviolet light, visible light, infrared, microwaves, radio waves (ULF, VLF, LF, MF, HF, long, short, HAM, VHF, UHF, SHF, EHF), cosmic microwave background radiation and other forms of radiation of the electromagnetic spectrum.

Carbon nanotubes have unique mechanical and electronic characteristics, which make them suitable for nanomechanical and nanoelectromechanical applications, in particular nanoscale electronics. Carbon nanotubes may act as antennas, but instead of transmitting and receiving radio waves, which are at the longest end of the electromagnetic spectrum, antennas of their size pick up the nanoscale wavelengths of visible light.

The presently disclosed embodiments generally relate to the use of carbon nanotubes to fabricate a nano-optics apparatus. The nano-optics apparatus is a multifunctional nanocomposite material made of a film having a top surface (illuminated surface) and a bottom surface (substrate surface) and a plurality of cylindrical channels filled with a dielectric material. An array of carbon nanotubes penetrate the film through the plurality of cylindrical channels. The array of carbon nanotubes have protruding portions that extend beyond a surface of the film and embedded portions that are within the film. The protruding portions act as nano-optical antennas and are capable of receiving (collecting), transmitting, and re-emitting an optical signal. The embedded portions act as a nano-coaxial transmission line (nano-CTL) and converts energy trapped in currents along the nano-optical antenna into a manageable signal and allows for propagation of the optical signal (external radiation) with a wavelength exceeding perpendicular dimensions of the carbon nanotubes.

FIG. 1A shows a schematic image of a nano-optics apparatus 100 synthesized in accordance with the presently disclosed embodiments. The nano-optics apparatus 100 has an array of carbon nanotubes 120 that penetrate a film 140 through cylindrical channels 160 filled with a dielectric material 180. Each carbon nanotube 120 has ends that act as nano-optical antennas 110 that protrude from each surface of the film, and a nano-coaxial transmission line (nano-CTL) 115 that is embedded within the film 140. In an embodiment, the film is metallic. FIG. 1B shows a cross-sectional view of the carbon nanotubes 120. In FIG. 1B, the diameter of the carbon nanotubes 120 is defined as 2r while the diameter of the cylindrical channels 160 is 2R. Those skilled in the art will recognize that the diameters may vary and be within the spirit and scope of the presently disclosed embodiments.

FIG. 2A shows a three-dimensional image of a basic structure configuration of a nano-optics apparatus 200 synthesized in accordance with the presently disclosed embodiments. The nano-optics apparatus 200 has an array of carbon nanotubes 220 that penetrate a film 240 through cylindrical channels filled with a dielectric material 280. Nano-optical antennas 210 extending beyond a metallic film 240 are capable of receiving and transmitting an electromagnetic radiation. The incoming light, collected by an array of the nano-optical antennas 210, is compressed into nanoscopic channels of the nano-coaxial transmission lines (cables), and is subsequently decompressed (and reemitted) on the opposite surface of the metallic film 240 by the nano-optical antenna 210 segments. The nano-optical antennas 210 possess the directional characteristics of conventional antennas, proving that conventional, radio technology applies to the nano-optics apparatus 200 in the visible frequency range. The conventional coaxial cables for light may also be developed. An advantage of using the nano-coaxial transmission lines is that they do not have a cut-off frequency (in contrast to waveguides), i.e. the nano-coaxial transmission lines allow for propagation of radiation with wavelength exceeding their perpendicular dimensions. The purpose of using the nano-coaxial transmission lines in the nano-optics apparatus 200 is to channel, and compress the external radiation into the confined space between the internal and external electrodes.

Figure 2B:
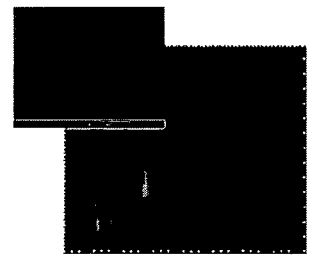
FIG. 2B shows a scanning electron microscopy (SEM) image of the carbon nanotubes used in the nano-optics apparatus of FIG. 2A.
Figure 2C:
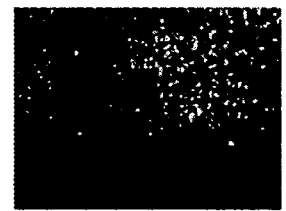
FIG. 2C shows a transmission optical microscope image of the nano-optics apparatus of FIG. 2A.

FIG. 2B shows a scanning electron microscopy image showing the relative characteristics of the carbon nanotubes 220 of FIG. 2A. The carbon nanotubes 220 are aligned linearly in the nano-optics apparatus 200. FIG. 2C shows a transmission electron microscopy image of the nano-optics apparatus 200 of FIG. 2A. In the nano-optics apparatus 200 of FIG. 2A, only the top half of the nano-optics apparatus 200 was etched during fabrication, the bottom half was not etched. This results in just the top half portion having transmitted light, as seen in the transmission optical microscopy image of FIG. 2C.

Figure 3A:
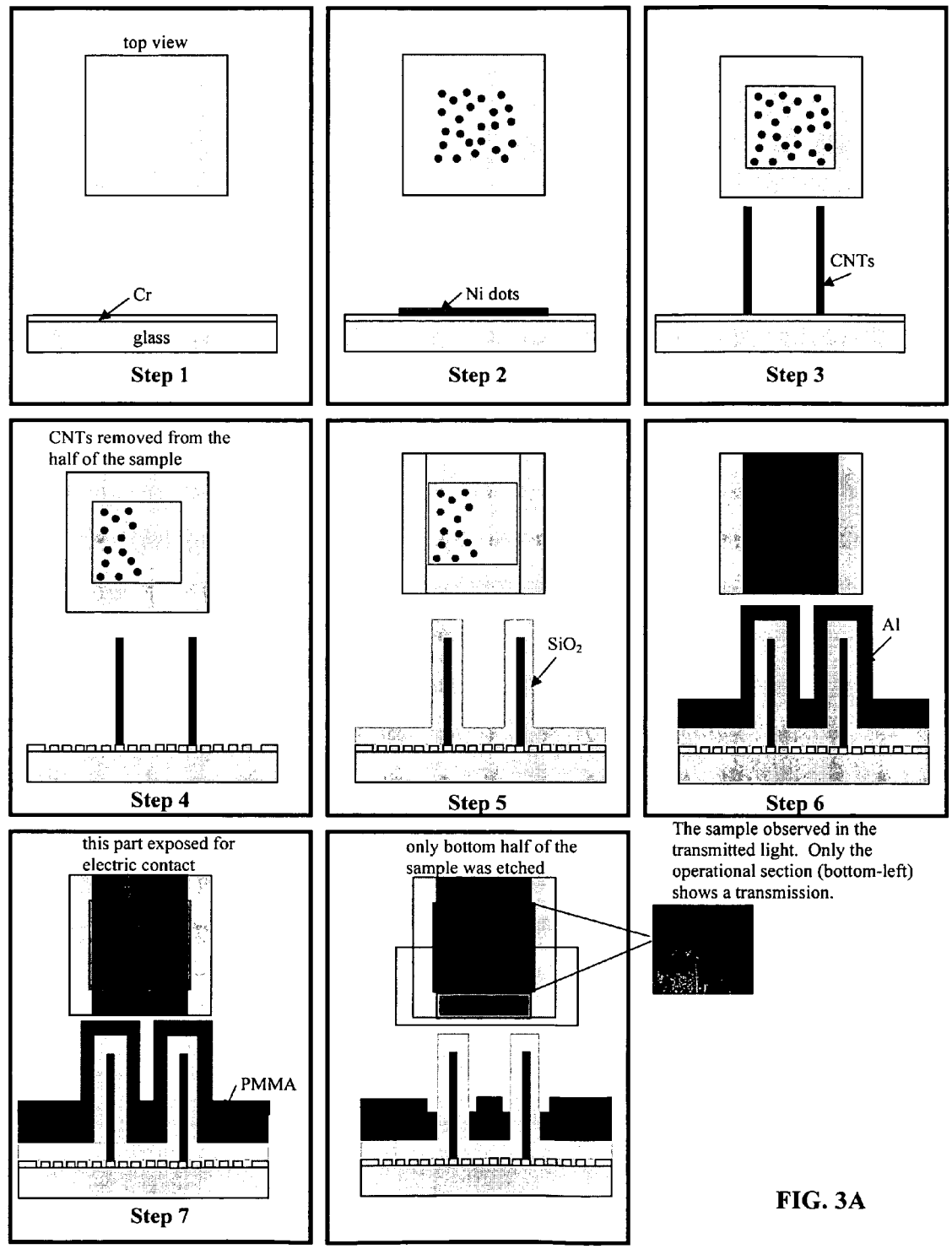
FIG. 3A shows the method steps for synthesizing a nano-optics apparatus in accordance with the presently disclosed embodiments.

FIG. 3A shows an exemplary method for synthesizing the nano-optics apparatus 100. In step 1, chromium is sputtered onto a glass substrate, typically at a thickness of about 15 nm. A selected thickness of catalytic transition metal (for example nickel) is electrodeposited onto the chromium glass followed by carbon nanotube growth, as shown in steps 2 and 3. Plasma enhanced chemical vapor deposition (PECVD) is used to etch the chromium layer, as shown in step 4. Typical PECVD lasts about an hour. A dielectric (or semiconductor) material (for example $SiO_x$, where $0 \leq x \leq 2$) is sputtered on the substrate, as shown in step 5. Those skilled in the art will recognize that the sputtered material may be made of any material having a specific function as required by an application of the nano-optics apparatus and still be within the scope and spirit of the presently disclosed embodiments. Typically, the dielectric material is coated to yield a thickness of about 100 nm. Aluminum is then sputtered followed by spin-coating of polymethylmethacrylate (PMMA) and baking at about 180° C. for about 40 minutes, as shown in steps 6 and 7. Typically, about 400 nm of aluminum is sputtered. In step 8, electrochemical etching of the aluminum layer on the tips of the nanorods 120 is accomplished at about 25 min in about 20% $H_2SO_4$, 4.0V, with the sample as anode, and a platinum electrode as cathode. In this example, only the bottom half of the sample was etched, resulting in just that portion having transmitted light, as seen in the transmission electron microscopy image.

Figure 3B:
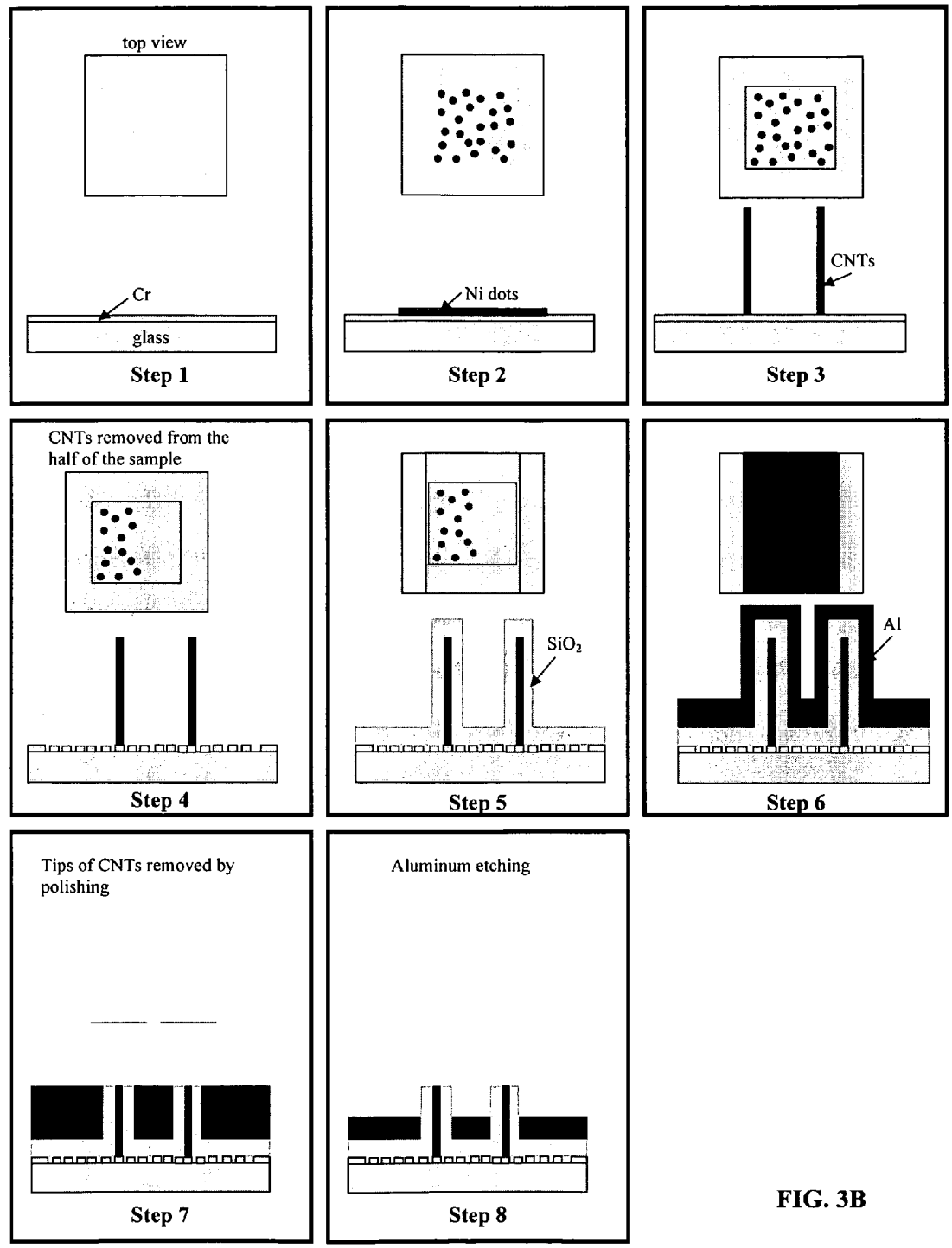
FIG. 3B shows the method steps for synthesizing a nano-optics apparatus in accordance with the presently disclosed embodiments.

FIG. 3B shows an alternative method for synthesizing the nano-optics apparatus 100. In step 1, chromium is sputtered onto a glass substrate, typically at a thickness of about 15 nm. A selected thickness of catalytic transition metal (for example nickel) is electrodeposited onto the chromium glass followed by carbon nanotube growth, as shown in steps 2 and 3. Plasma enhanced chemical vapor deposition (PECVD) is used to etch the chromium layer, as shown in step 4. Typical PECVD lasts about an hour. A dielectric (or semiconductor) material (for example $SiO_x$, where $0 \leq v \leq 2$) is sputtered on the substrate, as shown in step 5. Those skilled in the art will recognize that the sputtered material may be made of any material having a specific function as required by an application of the nano-optics apparatus and still be within the scope and spirit of the presently disclosed embodiments. Typically, the dielectric material is coated to yield a thickness of about 100 nm. Aluminum is then sputtered onto the coated substrate, as shown in step 6. Typically, about 400 nm of aluminum is sputtered. In step 7, the tips of the nanotubes are removed by polishing. In step 8, electrochemical etching of the aluminum layer on the tips of the nanorods 120 is accomplished at about 25 min in about 20% $H_2SO_4$, 4.0V, with the sample as anode and a platinum electrode as cathode.

Figure 4:
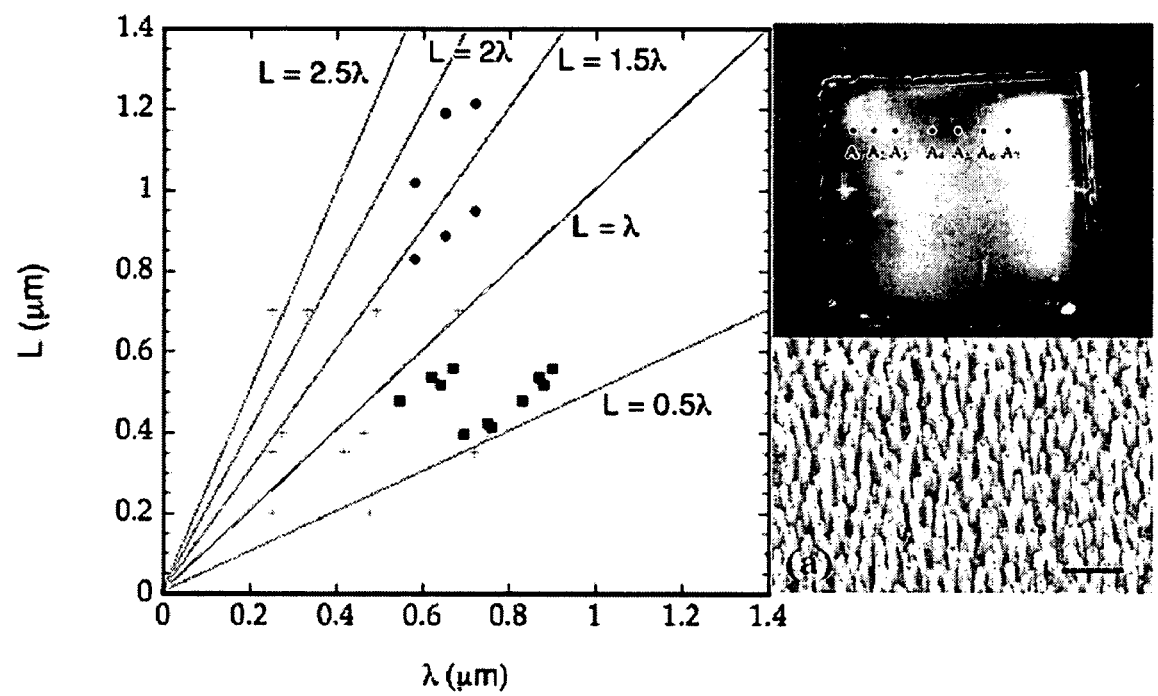
FIG. 4 shows a graph of nano-optical antenna length versus radiation wavelength, at a maximum radar cross section (RCS) scattering amplitude

FIG. 4 shows results demonstrating the nano-optical antenna action of an array of carbon nanotubes 120 in the visible frequency range. Both, the polarization, as well as, the nano-optical antenna length effects are shown in the radar cross section (RCS) type of experiment, in which an external radiation is reflected/scattered by an aperiodic array of carbon nanotubes 120, in excellent agreement with the antenna theory. The main section shows the nano-optical antenna length versus radiation wavelength, at a maximum RCS scattering amplitude. The upper right image in FIG. 4 shows an image of the sample with interference colors (from left to right) due to gradually changing nano-optical antenna 110 length. The lower right image in FIG. 4 shows the scanning electron microscope image of the carbon nanotubes.

Figure 5A:
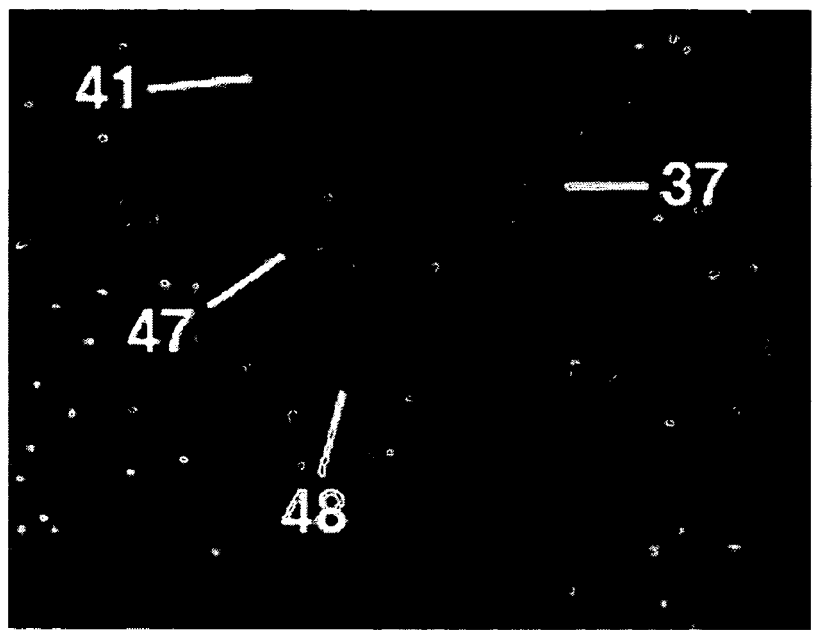
FIG. 5A shows visible and SEM images (overlayed) of a section of a nano-optics apparatus synthesized in accordance with the presently disclosed embodiments.
Figure 5B:
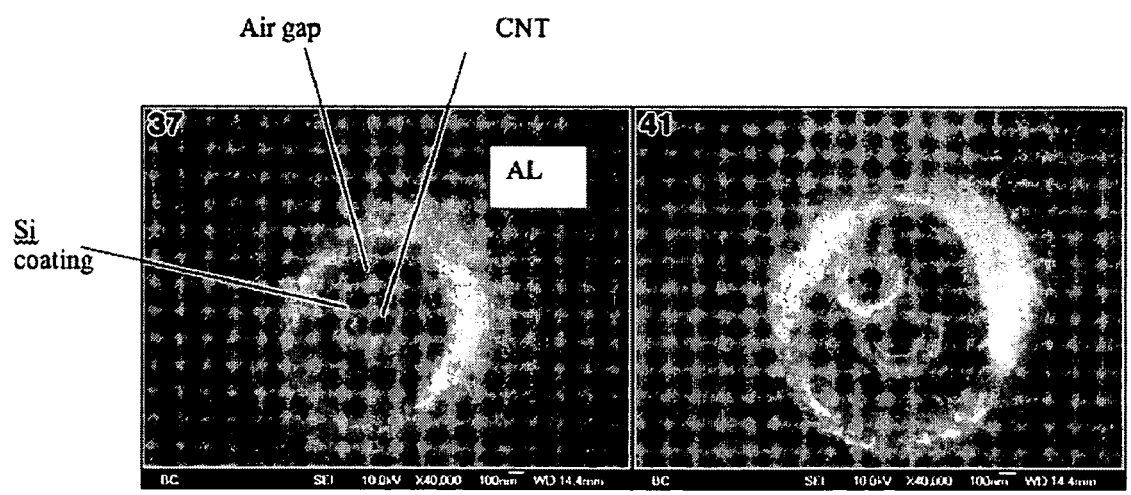
FIG. 5B shows scanning electron microscopy (SEM) images of the nano-optics apparatus of FIG. 5A.

FIG. 5A shows a visible image of a section of a nano-optics apparatus 100 synthesized in accordance with the presently disclosed embodiments. The carbon nanotubes 120 have been illuminated from behind with green and red lasers. Both green and red light is guided through the nano-CTLs 115. Each active nano-CTL 115 is surrounded by a green halo. Smaller red light spots are also visible. FIG. 5B shows the corresponding SEM close-up (top view) of the numbered carbon nanotubes 120. Carbon nanotubes number 37 and number 47 are single core, while number 41 and number 48 are double core. Carbon nanotubes number 37 consists of a nano-CTL core, coated with Si, located coaxially inside a cylindrical canal penetrating an Al film. An air gap (the dark ring) separates the Si coated CNT from the Al wall. As seen in FIG. 5B, the air gap is much thinner (about 100 nm) than the wavelength of the radiation (about 550 nm for green and about 650 nm for red). Thus, the subwavelength action of the nano-CTL has been demonstrated.

Photolithography and photomasking to generate a device pattern on a substrate base have been an essential part of fabrication of semiconductor devices. The ability to project a clear image of a very small feature onto a photoresist substrate is limited by the wavelength of the light that is used for the transfer of a photomask pattern onto the photoresist substrate and the ability of a reduction lens system to capture enough diffraction orders from the illuminated photomask. The formation of sub-100 nm patterns has reached intrinsic limitations. The realization of a nanometer-sized, highly precise pattern by conventional photolithography methods encounter many difficulties, because of limitations in the wavelength of light capable of being used and the necessity for provision of an apparatus and technology suitable for such light wavelength, as well as issues relating to the resolution of the polymer itself.

The processing steps generally involved in the conventional technique based on the use of photoresist masking includes: coating the surface of a substrate base with a photoresist material; focusing light from a mercury arc lamp or excimer laser through a complex system of lenses onto a "photomask" (also called a reticle), containing the desired image; passing light through the photomask and then focusing the light to produce the desired image on the photoresist substrate through a reduction lens system (the reduction of the system may vary depending on design, but current systems are typically on the order of 4×-5× in magnitude); removing the photoresist substrate exposed by the photomask in a photographic development process to leave behind only the unexposed regions of the photoresist on the base; unisotropical etching to remove the base material from the fabrication surface using ions or radicals in a plasma etching process on the bare regions of the base not protected by the photoresist material; and removing the photoresist material. All steps are essential in the conventional technique to duplicate the pattern of the photomask using photolithography to form ultra-fine ditches or recesses in the surface of the base. In general, it is necessary to repeat the basic steps a number of times to form ditches of different depths in the base before an operative semiconductor device may be produced.

Figure 6:
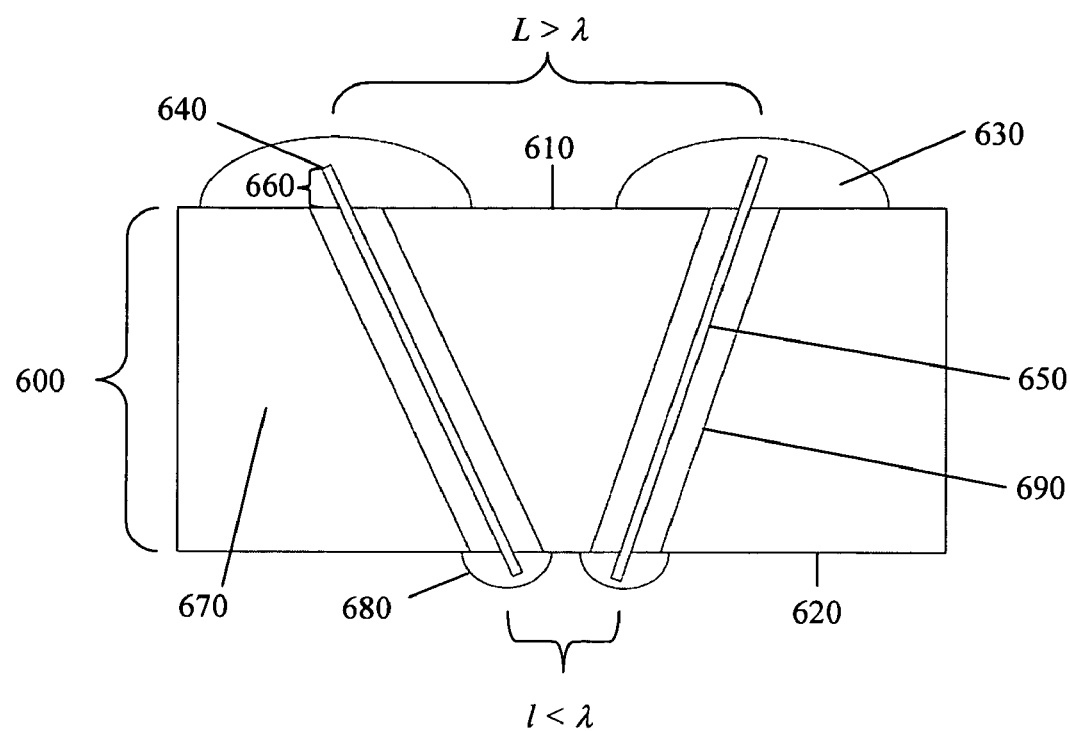
FIG. 6 shows a de-magnifying lens having an array of straight carbon nanotubes synthesized in accordance with the presently disclosed embodiments.

FIG. 6 shows a schematic image of a de-magnifying lens (reduction lens) 600 synthesized in accordance with the presently disclosed embodiments. The de-magnifying lens 600, is a device that may be used in any standard photolithographic system to enhance resolution of the photolithographic process. The de-magnifying lens 600 works via nano-optics, where an array of carbon nanotubes 640 penetrate a film 670 and connect receiving pixels (lenses) 630 on a top (illuminated) surface 610 with emitting pixels 680 on a bottom (substrate) surface 620. The de-magnifying lens 600 allows light transport only through nano-CTLs 650 and related pixels, thus the surrounding film 670 is non-transparent and does not allow light propagation. The array of receiving pixels (lenses) 630 (with diameter equal to about a wavelength of incoming radiation) fabricated from a luminescent or other light scattering/diffusive material, exists on the top surface 610 of the de-magnifying lens 600, and the corresponding array of small pixels 680 (subwavelength size) on the bottom surface 620 of the de-magnifying lens 600. Each receiving pixel 630 on the top surface 610 is connected to the emitting pixel 680 on the bottom surface 620 via the carbon nanotubes 640, which are built of an internal core of nano-CTLs 650 and appropriate transparent dielectric coating 690. Examples of dielectric coatings 690 include, but are not limited to, any dielectric material of high optical transparency such as ceramic materials: aluminum oxide ($Al_2O_3$) or silicon oxide ($siO_x$, where $0 \leq x \leq 2$), and polymers: polystyrene (PS) or polymethyl metacrylate (PMMA). The layout presented in FIG. 6 is simplified and assumes the surrounding film 670 to be non-transparent and metallic. The surrounding film 670 is also the outer electrode for the nano-CTLs 650, thus metallic properties are necessary. If the nano-CTLs 650 are coated on the outside with a metallic layer, the surrounding film 670 can be non-metallic.

The receiving pixels 630 collect light that is impinging on them and transfers the light toward the entrance of the nano-CTLs 650 via nano-optical antennas 660. The receiving pixels 630 collect light and should not be completely transparent, otherwise the light would remain in the nano-optical antenna 660.

An image (of a "chip" circuit, for example) is projected onto the top surface 610, for example using a conventional photolithography technique. The averaged electric field in a receiving illuminated pixel 630 excites the nano-optical antenna 660 of the carbon nanotubes 640, and light is transmitted down to the other surface through the nano-CTL 650, and subsequently is re-emitted into the emitting pixel 680 on the bottom surface via the nano-optical antenna 660 on the other surface of the nano-CTL 650. The de-magnifying lens 600 design assures a geometrical convergence of the nano-CTLs 650 on the substrate surface 620, so that the inter-pixel separation l, on the substrate surface 620, is smaller than that L on the illuminated surface 610. Geometrical convergence of the de-magnifying lens 600 assures that all dimensions of the features on the illuminated surface 610, such as receiving pixel 630 diameter and inter-pixel spacing L, are represented by the same kind of features on the substrate surface 620 but scaled down, with proportions constrained, by a certain factor. An image projected by a standard photolithographic system onto the illuminated surface 610 of the de-magnifying lens 600, is reduced in size by a factor of L/l on the substrate surface 620. This factor may be made >10, and thus a subwavelength (nanoscale) resolution may be achieved. This reduction in size image on the substrate surface 620 can, via near field coupling, expose a photoresist, with features in the nanoscale size. Thus, the de-magnifying lens 600 may be used to turn a standard photolithography system into a nanolithography system.

The surface area per pixel on the illuminated surface 610 is about $L^2$, and only $l^2$ on the substrate surface 620. Thus, for a flat film 670, the imaged area on the substrate surface 620 is always much smaller than on the illuminated surface 610. The consequence is that for a uniform, large pixel array on the illuminated surface 610, there will be well-separated groups of pixel arrays on the substrate surface 620. For example, the feature size of an image, or the feature rays may be a 10×10 micron array, which would produce a scaled down image array of 100×100 nanometers. In an embodiment, a step and repeat method may be used to obtain larger features. The receiving pixels 630 on the illuminated surface are much bigger than the emitting pixels 680 on the substrate surface 620. With a large area of exposure this may create discontinuities on the substrate surface 620 in the produced image. One of the solutions to this scenario would be to use a step and repeat exposure method in which the film 670 would be subsequently stepped to fill in the gaps on the spaces of the substrate surface 620. Employing a semi-spherical or semi-cylindrical geometry of the film improves the situation because there is a stream of coaxial cables coming from the outer surface of a semi-cylindrical structure converging into the region below. In either case, the full coverage on the substrate surface 620 can be achieved by using the a step-and-repeat strategy known to those skilled in the art. This way the region may be enhanced or made bigger.

If a square pixel array on the illuminated surface 610 of the film 670 is 100×100 pixels, there will be a square pixel array of 100×100 on the substrate surface 620 of the film 670 as well, but the distances will be 10 times smaller. There is a 1:1 correspondence assured by the nano-CTLs 650 connecting the receiving pixels 630 with the emitting pixels 680.

Figure 7:
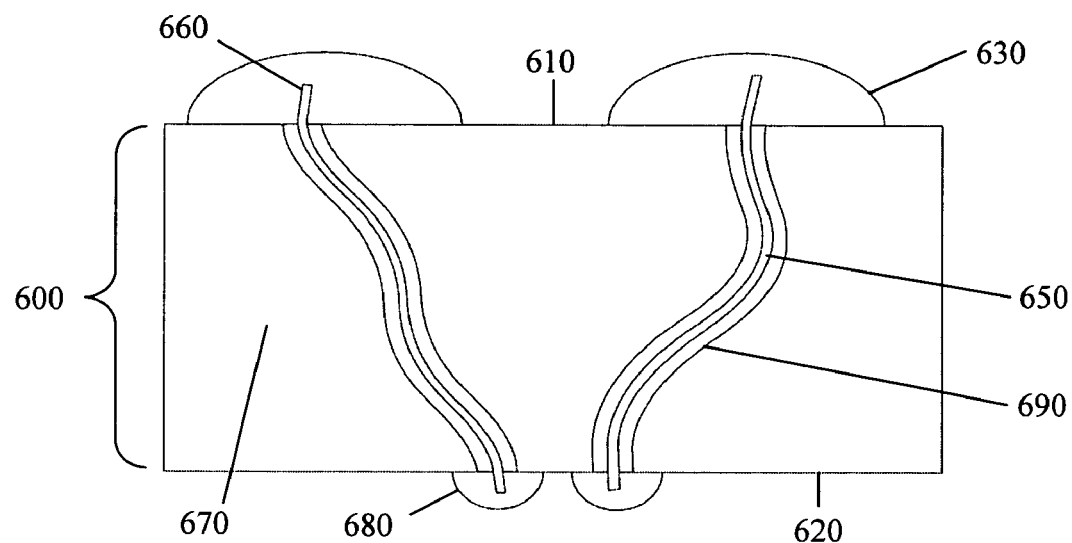
FIG. 7 shows a de-magnifying lens having an array of non-straight carbon nanotubes synthesized in accordance with the presently disclosed embodiments.
Figure 8:
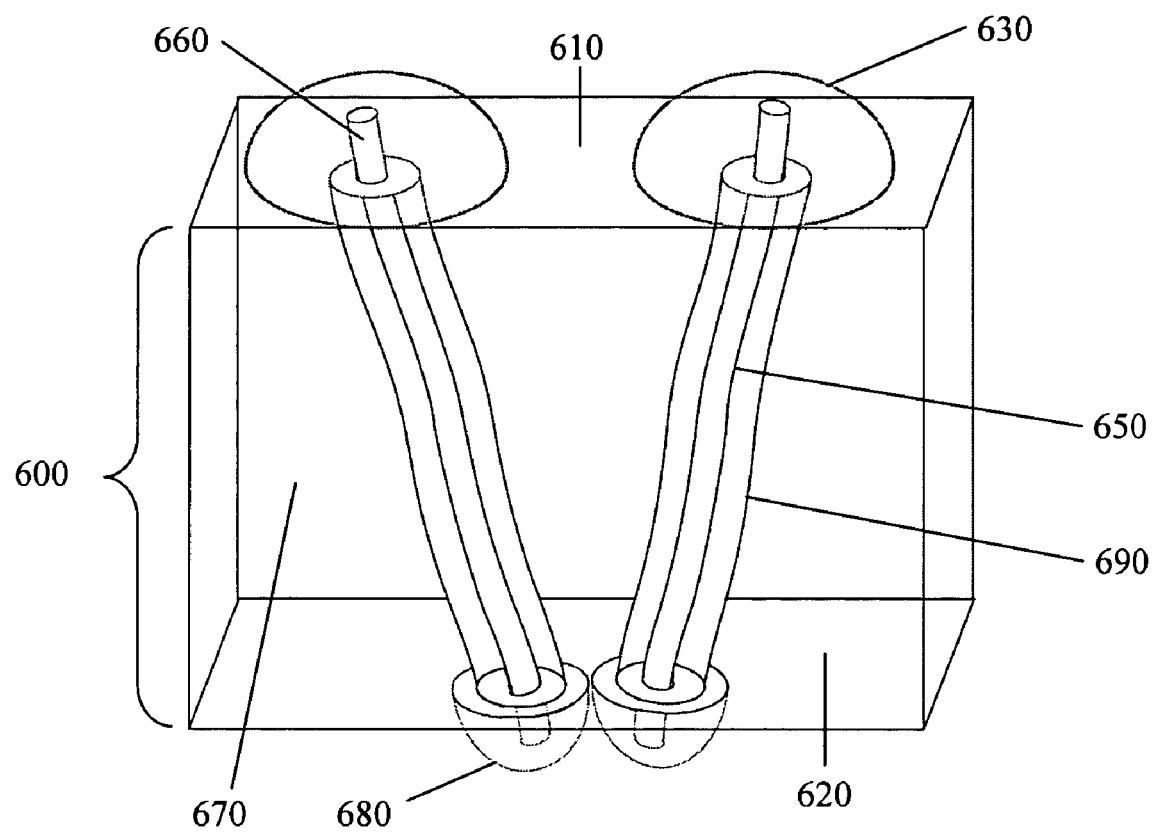
FIG. 8 shows a three-dimensional schematic image of the de-magnifying lens of FIG. 7 synthesized in accordance with the presently disclosed embodiments.

As the carbon nanotubes 640 penetrate through the film 670 the carbon nanotubes 640 converge. In the embodiment shown in FIG. 6, the de-magnifying lens 600 is built of an array of straight carbon nanotubes 640. FIG. 7 shows a variation where an array of carbon nanotubes 640 are non-linear. The three-dimensional (3D) schematic image of the embodiment shown in FIG. 7 is shown in FIG. 8. The array of carbon nanotubes 640 may be built so that a S-shape, zigzag, or other converging pattern is formed.

Figure 9:
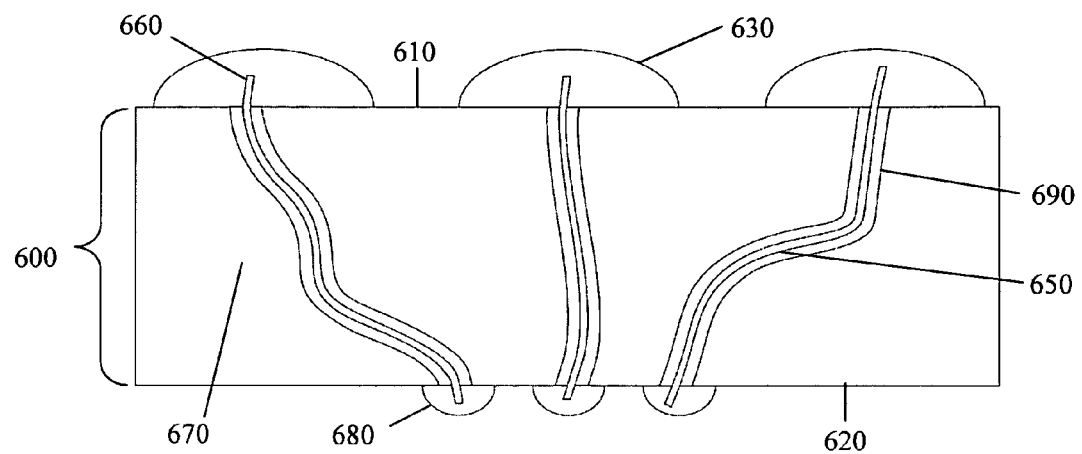
FIG. 9 shows a de-magnifying lens having pixels on a top surface that directly correspond to pixels on a bottom surface synthesized in accordance with the presently disclosed embodiments.
Figure 10:
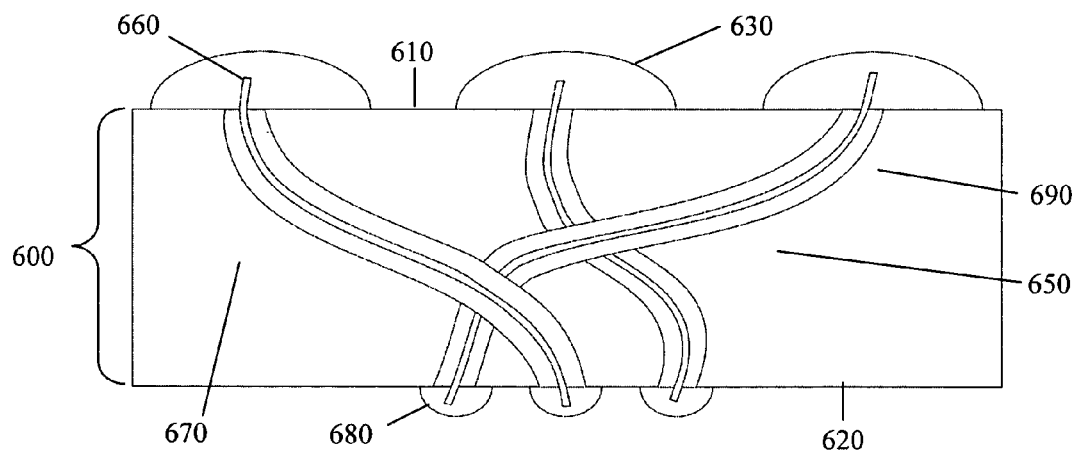
FIG. 10 shows a de-magnifying lens having pixels on a top surface that are scrambled with respect to pixels on a bottom surface synthesized in accordance with the presently disclosed embodiments.

The embodiments demonstrated in FIGS. 9 and 10 are modifications of the layout shown in FIGS. 6 and 7. Pixels on the illuminated surface 610 may be directly mapped on the substrate surface 620 by direct wiring through nano-CTLs 650, as shown in FIG. 9, or indirectly mapped by scrambled wiring (FIG. 10).

In the embodiment shown in FIG. 9, pixels on both surfaces are directly wired through appropriate nano-CTLs 650. The light-receiving pixels 630 on the illuminated surface 610 will capture light and transfer it through the nano-CTLs 650 to the corresponding emitting pixels 680 on the substrate surface 620. The substrate surface 620 is therefore a direct map of the illuminated surface 610 but in a different scale (i.e. smaller). The direct wiring may be done using straight carbon nanotubes shown in FIG. 6 or non-straight carbon nanotubes shown in FIG. 7.

For manufacturing reasons, i.e. to simplify the production process, pixel mapping/wiring may be scrambled, i.e. pixels on both surfaces may be connected indirectly with each other. In the embodiment shown in FIG. 10, receiving pixels 630 on the illuminated surface 610 are indirectly wired to the emitting pixels 680 on the substrate surface 620 by non-straight carbon nanotubes. A de-magnifying lens 600 built on this scrambled array of carbon nanotubes will produce a distorted image. These distortions may be fixed later by computer mapping of pixels in order to receive a real (non-scrambled) image. Therefore, all array imperfections caused by scrambled wiring during manufacturing process may be easily fixed.

Scrambled wiring using carbon nanotubes may be also introduced intentionally to build an encoding photolithographic device. Unique scrambled wiring will produce a distorted image when used as a de-magnifying lens in the photolithographic setup, unless an appropriate computer algorithm is used to decode the image and map all the pixels in an array accordingly.

An image projected by conventional optics onto the illuminated surface 610 of the de-magnifying lens 600, for example by a standard photolithographic system, is reduced in size by a factor of L/l on the substrate surface 620. This factor may be made >10, and thus a subwavelength (nanoscale) resolution may be achieved. This reduction in size image on the substrate surface 620 may, via near field coupling, expose a photoresist with nanoscale feature sizes. Thus, the de-magnifying lens 600 may be used to turn a standard photolithographic system into a nanolithography system. The apparatus of FIGS. 6-9 employs the light transmitting nanostructures (nano-CTLs) as optical processors, capable of de-magnifying and delivery of an optical pattern of a nanostructure onto a photoresist material. The resolution of conventional optical lithography schemes is mainly limited by the wavelength of the light used for the transfer of a photomask pattern onto a photoresist material. When the de-magnifying lens 600 of the presently disclosed embodiments is placed between the conventional photolithography optical system and the photoresist material, there will be an about 10-1 reduction in sizes to the sub-wavelength domain. The carbon nanotubes act as a de-magnifying lens imaging a super-wavelength pattern into the identical, but scaled-down sub-wavelength pattern.

Figure 11:
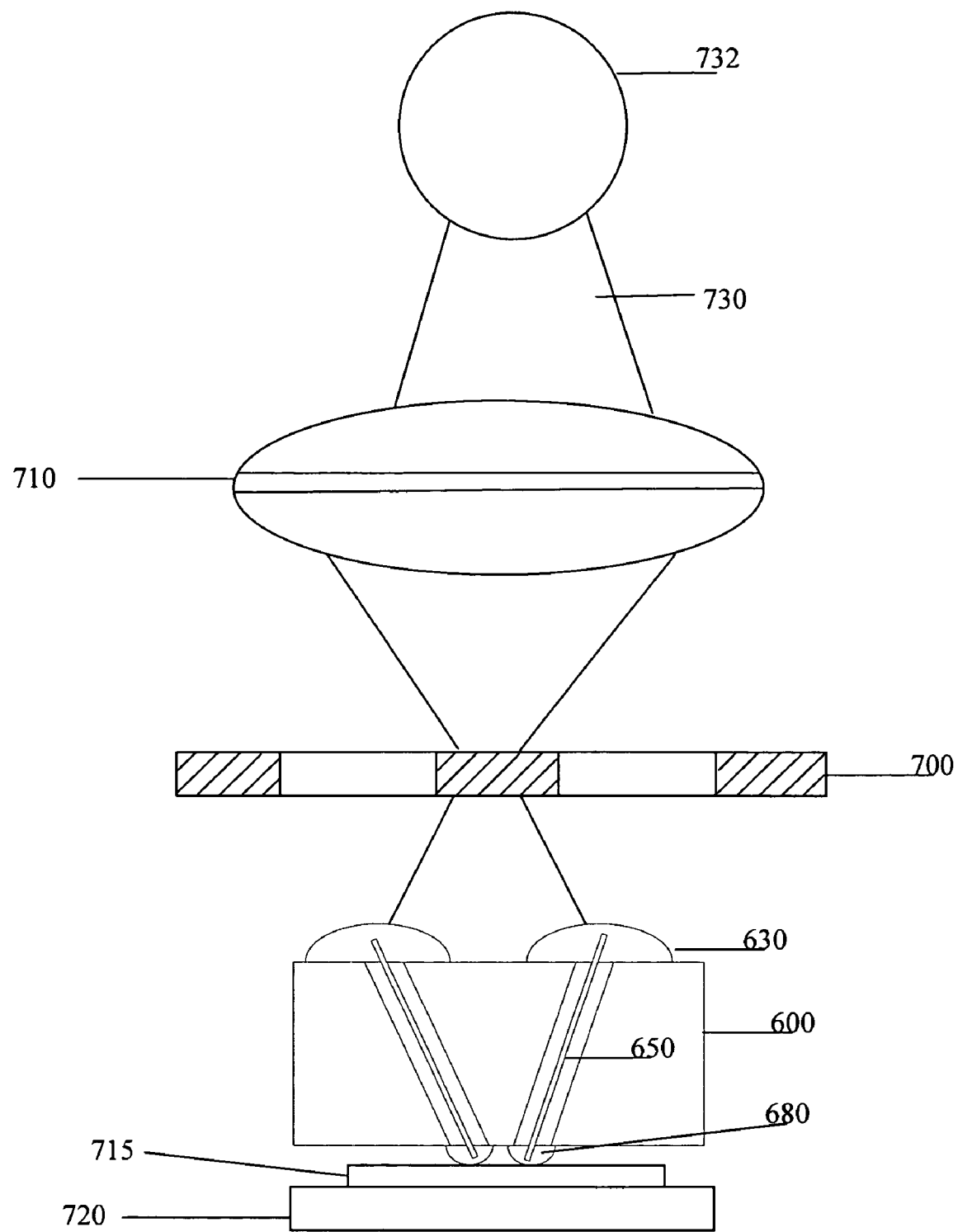
FIG. 11 shows a schematic of a de-magnifying lens of the presently disclosed embodiments in use with a representative photolithography system.

FIG. 11 shows a schematic drawing of a de-magnifying lens 600 of the presently disclosed embodiments in use with a representative photolithography system 710. Those skilled in the art will recognize that the de-magnifying lens of the presently disclosed embodiments can be used with any photolithography system 710 and be within the spirit and scope of the presently disclosed embodiments. The de-magnifying lens 600 is placed between a photomask 700 and a photoresist 715 covered substrate 720. In an embodiment, the de-magnifying lens 600 is brought into physical contact (direct proximity) with the photoresist 715 covered substrate 720. In direct proximity, a small gap, about 10 to about 25 nanometers, is maintained between the photoresist 715 covered substrate 720 and the de-magnifying lens 600 during exposure. The distance between the photoresist 715 covered substrate 720 and the de-magnifying lens 600 should be smaller than the wavelength of incoming light 730 from a light source 732. For example, for UV light with a wavelength of 320 nm the gap size should not be larger than around 300 nm. The nano-optical antennas are designed to be brought into conformal contact with the photoresist 715 covered substrate 720 to be exposed such that the light 730 guided through the nano-CTLs 650 and then the nano-optical antennas, is coupled from there directly into the photoresist 715 covered substrate 720.

The incoming light 730 enters through the photomask 700 and is collected by receiving pixels 630 on the illuminated surface of the de-magnifying lens 600. The incoming light 730 is then transported by nano-CTLs 650 to the substrate surface of the de-magnifying lens 600 and re-emitted by emitting pixels 680. The receiving pixels 630 on the illuminated surface, are spaced within a distance that may be resolved by an incoming light wavelength. The distance between the neighboring receiving pixels 630 is not smaller than the wavelength of incoming light. The emitting pixels 680 on the substrate surface are placed with significantly smaller spacing, i.e. the distance between the neighboring emitting pixels 680 is much smaller than wavelength of incoming light. The de-magnifying lens 600 will then direct light going through the photomask 700 and project it onto a much smaller area than covered by the photomask 700. Thus, even when longer wavelengths are used, features much smaller than the wavelength may still be resolved and hence the resolution enhancement is possible. Those skilled in the art will recognize that any of the de-magnifying lenses of the presently disclosed embodiments may be used in conjunction with a standard photolithography setup. A receiving pixel 630 on the illuminated surface is able to transfer energy into the nano-CTL 650, which in turn merges the light 730 into the emitting pixel 680 on the substrate surface of the de-magnifying lens 600.

Various nano-optical antenna arrangements are within the spirit and scope of the presently disclosed embodiments. The nano-optical antennas described herein possess the directional characteristics of conventional antennas, proving that conventional, radio technology applies to nano-optics systems in the visible frequency range.

In an embodiment, the carbon nanotubes have a graded structure at the nano-optical antenna end. In a graded structure, the diameter of the carbon nanotubes increases toward the nano-optical antenna end. In a graded structure, a diameter of the carbon nanotubes becomes larger towards the nano-optical antenna end coupling to the optical source. The graded carbon nanotubes provides greater photon collection. The graded horn section may have shapes including but not limited to hyperbolic, parabolic, spheroidal, linear, parabolically sloped walls, conical walls or other shapes known in the microwave technology art.

In an embodiment, the carbon nanotubes have a rough-edge structure. In the rough-edge structure, an edge of the nano-optical antenna end is jagged, or may be periodically shaped (e.g., saw-tooth, a series of semicircular sections, etc.). The depth of the cuts should be of the order of the radiation wavelength.

In an embodiment, the carbon nanotubes have a ring-cut structure. In the ring-cut structure, an upper portion of the nano-optical antenna end is completely or partially separated from the rest of the carbon nanotubes below.

In an embodiment, the carbon nanotubes have a double-cone structure. The double-cone structure has two cones adjacent to an end of the carbon nanotubes.

In an embodiment, the carbon nanotubes have a loop termination inside a horn. In the loop termination inside a horn, the nano-CTL forms a loop, which may, but does not have to, attach to a side wall of the horn.

In an embodiment, the carbon nanotubes have a disc collector engaging the nano-optical antenna. The disc collector is attached to the internal conductor of the nano-CTL.

In an embodiment, the carbon nanotubes have a bow-tie collector engaging the nano-optical antenna. The bow-tie collector is attached to the internal conductor of the nano-CTL. Other shapes such as planar spiral, vertical spiral, and other shapes may also be attached to the internal conductor of a nano-CTL and used as collectors and/or receivers.

In an embodiment, the carbon nanotubes have a Y-junction nano-CTL splitter. The Y-junction nano-CTL splitter splits the signal from a single nano-CTL into two, or compresses two signals into a single signal. The Y-junction nano-CTL splitter may split the signal from a single nano-CTL into multiple signals, or compress multiple signals into a single signal.

In an embodiment, the carbon nanotubes have a nano-CTL coupler. A plurality of carbon nanotubes may be coupled together via a stripline. In this embodiment, each carbon nanotube couples to the optical signal from both ends, either via receivers (dipole antenna via inner conductor extension, or receivers), or coax couplers. Such a metal film is transparent, as each carbon nanotube mediates partial spherical waves, one-by-one (thus the term "discrete optics").

The nano-optics apparatus of the presently disclosed embodiments may be used with lithography systems for manufacturing applications in: nano-devices, microstructures, advanced packaging, bio devices, optical components and semiconductor devices.

A method of fabricating a nano-optics apparatus comprises preparing a plurality of nanorods on a substrate, coating the nanorods with a semiconducting material, and coating the semiconductor with a conducting material. The method yields a metal-semiconductor-metal coaxial structure.

In an embodiment, the plurality of nanorods on the substrate are oriented perpendicular to the substrate. In an embodiment, the plurality of nanorods on the substrate are oriented approximately orthogonal to the substrate. In an embodiment, the plurality of nanorods are not perpendicular to the substrate.

In an embodiment, the nanorods are carbon nanotubes. This embodiment comprises coating a substrate with a catalytic material; growing a plurality of carbon nanotubes as internal cores of nanocoax units on the substrate; oxidizing the substrate; coating the substrate with a semiconducting film; and filling with a metallic medium that wets the semiconducting film of the nanocoax units.

A nano-optics apparatus may be fabricated using the method outlined below or similar methods. A flexible or inflexible substrate such as an aluminum (Al) foil is coated with catalytic material (e.g., Ni) by any suitable technique including but not limited to wet chemical deposition, electrochemical deposition, CVD, sputtering, evaporation and similar techniques. The processed substrate is used for a catalytic growth of carbon nanotubes. Alternatively, the substrate could be employed as an electrode for electrodeposition of any suitable nanorods as internal conductors and cores of nanocoax units, without the use of the catalytic material. The growth of the carbon nanotubes may be performed by any appropriate technique including CVD or PECVD and similar techniques. After depositing or growing of the nanorods, the remaining exposed surface of the substrate, i.e. the area free of nanorods, may be oxidized to fabricate a dielectric layer between the substrate and the outer conductor. Alternatively, the oxidation step may be skipped. Then, the entire system may be coated with a semiconducting layer by any suitable technique (e.g. CVD, electro-chemical deposition, and similar techniques), and eventually filled or coated with a metallic medium (e.g. tin (Sn) powder). In one embodiment, the metallic medium should be selected and processed to obtain a weak wetting contact between the metallic medium and the outer conductor of the nanocoax, yielding a graded diameter end. The metallic medium may be deposited by any conventional technique, e.g. spraying, painting, spin-coating, CVD, evaporation, sputtering, and similar techniques.

An apparatus and methods for manipulating light using nanocoax structures is disclosed in U.S. Provisional Application Ser. No. 60/799,293, filed May 9, 2006, which is hereby incorporated herein by reference in its entirety for the teachings therein.

All patents, patent applications, and published references cited herein are hereby incorporated by reference in their entirety. It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. A de-magnifying lens for use in a standard photolithography system comprising:
    a film having a top surface, a bottom surface and a plurality of cylindrical channels containing a dielectric material; and
    an array of carbon nanotubes penetrating and converging through the film through the plurality of cylindrical channels,
    wherein an image on the top surface of the film is converted into a de-magnified image on the bottom surface of the film by the carbon nanotubes,
    wherein each carbon nanotube connects a light-receiving pixel on the top surface of the film with a light-emitting pixel on the bottom surface of the film, and
    wherein the light-receiving pixels on the top surface of the film are indirectly mapped to the light-emitting pixels on the bottom surface of the film by scrambled wiring through a nano-coaxial transmission line.

2. The de-magnifying lens of claim 1 wherein each carbon nanotube has a portion that extends beyond the top surface of the film, a portion that is embedded within the film, and a portion that extends beyond the bottom surface of the film.

3. The de-magnifying lens of claim 2 wherein the portion that extends beyond the top surface of the film and the bottom surface of the film act as nano-optical antennas for receiving, transmitting, and re-emitting an optical signal.

4. The de-magnifying lens of claim 3 wherein the nano-optical antenna on the top surface of the film compresses the optical signal into nanoscopic dimensions.

5. The de-magnifying lens of claim 3 wherein the portion that is embedded within the film acts as a nano-coaxial transmission line and converts energy trapped in currents along the nano-optical antenna on the top surface of the film into a manageable signal and allows for propagation of the optical signal with a wavelength exceeding a perpendicular dimension of the carbon nanotube through the nano-coaxial transmission line.

6. The de-magnifying lens of claim 1 wherein light from an optical signal is collected by the receiving pixel on the top surface of the film which excites the nano-optical antenna on the top surface of the film to transmit the light through the nano-coaxial transmission line to the nano-optical antenna on the bottom surface of the film and re-emit the light into the light-emitting pixel.

7. The de-magnifying lens of claim 1 wherein the light-receiving pixels on the top surface of the film are directly mapped to the light-emitting pixels on the bottom surface of the film by direct wiring through the nano-coaxial transmission lines.

8. A nanolithography apparatus comprising:
    a metallic film having a top surface, a bottom surface and a plurality of cylindrical channels containing a dielectric material; and
    an array of nanorods penetrating the metallic film through the plurality of cylindrical channels, the array of nanorods having a protruding portion that extends beyond a surface of the metallic film and an embedded portion that is within the metallic film,
    wherein each nanorod connects a light-receiving pixel on the top surface of the film with a light-emitting pixel on the bottom surface of the film, and
    wherein the light-receiving pixels on the top surface of the film are indirectly mapped to the light-emitting pixels on the bottom surface of the film by scrambled wiring through a nano-coaxial transmission line.

9. The nanolithography apparatus of claim 8 wherein the protruding portion acts as a nano-optical antenna for receiving and transmitting an electromagnetic radiation at a visible frequency.

10. The nanolithography apparatus of claim 9 wherein the nano-optical antenna compresses light into nanoscopic dimensions.

11. The nanolithography apparatus of claim 8 wherein the embedded portion acts as a nano-coaxial transmission line (CTL) for propagation of external radiation with a wavelength exceeding the perpendicular dimension of the nanorod.

12. The nanolithography apparatus of claim 8 wherein each nanorod has a portion that extends beyond the top surface of the film, a portion that is embedded within the film, and a portion that extends beyond the bottom surface of the film.

13. The nanolithography apparatus of claim 12 wherein the portion that extends beyond the top surface of the film and the bottom surface of the film act as nano-optical antennas for receiving, transmitting, and re-emitting an optical signal.

14. The nanolithography apparatus of claim 13 wherein the nano-optical antenna on the top surface of the film compresses the optical signal into nanoscopic dimensions.

15. The nanolithography apparatus of claim 13 wherein the portion that is embedded within the film acts as a nano-coaxial transmission line and converts energy trapped in currents along the nano-optical antenna on the top surface of the film into a manageable signal and allows for propagation of the optical signal with a wavelength exceeding a perpendicular dimension of the carbon nanotube through the nano-coaxial transmission line.

16. The nanolithography apparatus of claim 8 wherein light from an optical signal is collected by the receiving pixel on the top surface of the film which excites the nano-optical antenna on the top surface of the film to transmit the light through the nano-coaxial transmission line to the nano-optical antenna on the bottom surface of the film and re-emit the light into the light-emitting pixel.

17. The nanolithography apparatus of claim 8 wherein the light-receiving pixels on the top surface of the film are directly mapped to the light-emitting pixels on the bottom surface of the film by direct wiring through the nano-coaxial transmission lines.

18. A de-magnifying lens for use in nanolithography comprising:
    a film having a top surface, a bottom surface and a plurality of cylindrical channels containing a dielectric material coated with a conductor; and
    an array of nanorods penetrating and converging through the film through the plurality of cylindrical channels,
    wherein an image on the top surface of the film is converted into a de-magnified image on the bottom surface of the film by the nanorods,
    wherein each nanorod connects a light-receiving pixel on the top surface of the film with a light-emitting pixel on the bottom surface of the film, and
    wherein the light-receiving pixels on the top surface of the film are indirectly mapped to the light-emitting pixels on the bottom surface of the film by scrambled wiring through a nano-coaxial transmission line.

19. The de-magnifying lens of claim 18 wherein each nanorod has a portion that extends beyond the top surface of the film, a portion that is embedded within the film, and a portion that extends beyond the bottom surface of the film.

20. The de-magnifying lens of claim 19 wherein the portion that extends beyond the top surface of the film and the bottom surface of the film act as nano-optical antennas for receiving, transmitting, and re-emitting an optical signal.

21. The de-magnifying lens of claim 20 wherein the nano-optical antenna on the top surface of the film compresses the optical signal into nanoscopic dimensions.

22. The de-magnifying lens of claim 20 wherein the portion that is embedded within the film acts as a nano-coaxial transmission line and converts energy trapped in currents along the nano-optical antenna on the top surface of the film into a manageable signal and allows for propagation of the optical signal with a wavelength exceeding a perpendicular dimension of the nanorod through the nano-coaxial transmission line.

23. The de-magnifying lens of claim 18 wherein light from an optical signal is collected by the receiving pixel on the top surface of the film which excites the nano-optical antenna on the top surface of the film to transmit the light through the nano-coaxial transmission line to the nano-optical antenna on the bottom surface of the film and re-emit the light into the light-emitting pixel.

24. The de-magnifying lens of claim 18 wherein the light-receiving pixels on the top surface of the film are directly mapped to the light-emitting pixels on the bottom surface of the film by direct wiring through the nano-coaxial transmission lines.

\* \* \* \* \*